US012588499B2

(12) United States Patent
Eid et al.

(10) Patent No.: US 12,588,499 B2
(45) Date of Patent: Mar. 24, 2026

(54) INTEGRATED CIRCUIT HEAT SPREADER INCLUDING SEALANT INTERFACE MATERIAL

(71) Applicant: Intel Corporation, Santa Clara, CA (US)

(72) Inventors: Feras Eid, Chandler, AZ (US); Sergio Antonio Chan Arguedas, Chandler, AZ (US); Bamidele Daniel Falola, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1233 days.

(21) Appl. No.: 16/905,731

(22) Filed: Jun. 18, 2020

(65) Prior Publication Data

US 2021/0398871 A1    Dec. 23, 2021

(51) Int. Cl.
| | |
|---|---|
| *H01L 23/367* | (2006.01) |
| *H01L 21/48* | (2006.01) |
| *H01L 23/31* | (2006.01) |
| *H01L 23/373* | (2006.01) |
| *H10W 40/00* | (2026.01) |
| *H10W 40/22* | (2026.01) |
| *H10W 40/25* | (2026.01) |
| *H10W 74/10* | (2026.01) |

(52) U.S. Cl.
CPC ......... *H10W 40/22* (2026.01); *H10W 40/037* (2026.01); *H10W 40/258* (2026.01); *H10W 74/124* (2026.01); *H10W 74/127* (2026.01)

(58) Field of Classification Search
CPC ... H01L 23/10; H01L 23/367; H01L 23/3142; H01L 2924/16598; H01L 2924/16798
See application file for complete search history.

(56) References Cited

U.S. PATENT DOCUMENTS

| | | | | | |
|---|---|---|---|---|---|
| 4,572,924 A | * | 2/1986 | Wakely | .................. | H01L 23/10 |
| | | | | | 257/668 |
| 4,888,449 A | * | 12/1989 | Crane | ................. | H01L 23/3675 |
| | | | | | 29/827 |
| 5,155,299 A | * | 10/1992 | Mahulikar | ............ | H01L 23/057 |
| | | | | | 174/536 |
| 5,744,752 A | * | 4/1998 | McHerron | .............. | H01L 23/10 |
| | | | | | 257/781 |
| 5,956,576 A | * | 9/1999 | Toy | ......................... | H01L 23/10 |
| | | | | | 438/122 |

(Continued)

*Primary Examiner* — Vincent Wall
(74) *Attorney, Agent, or Firm* — Essential Patents Group, LLP

(57) ABSTRACT

A hybrid integrated heat spreader suitable for an integrated circuit (IC) die package. The hybrid integrated heat spreader includes a top sheet material and a sealant interface material located where the heat spreader is to contact an assembly substrate. The sealant interface material may offer greater adhesion to a sealant employed between the interface material and the package substrate. In some examples, the sealant interface material has a greater surface roughness and/or a different composition than a surface of the integrated heat spreader that is in close thermal contact with an IC die through a thermal interface material. With the sealant interface material improving adhesion, the sealant may have a higher bulk modulus, enabling the integrated heat spreader to impart greater stiffness to the IC die package assembly.

19 Claims, 9 Drawing Sheets

(56) References Cited

U.S. PATENT DOCUMENTS

| | | | | |
|---|---|---|---|---|
| 6,204,454 B1* | 3/2001 | Gotoh | H01L 23/5383 | |
| | | | 428/209 | |
| 6,777,612 B2* | 8/2004 | Sugiura | H01L 24/97 | |
| | | | 257/730 | |
| 8,941,017 B2* | 1/2015 | Nagano | H05K 3/341 | |
| | | | 174/520 | |
| 10,014,189 B2* | 7/2018 | Suzuki | H01L 23/10 | |
| 10,566,313 B1* | 2/2020 | Li | H01L 24/48 | |
| 2004/0037059 A1* | 2/2004 | Stiborek | H01L 23/10 | |
| | | | 257/E23.101 | |
| 2004/0161655 A1* | 8/2004 | Murphy | H01M 8/0267 | |
| | | | 429/510 | |
| 2005/0023661 A1* | 2/2005 | Matsubara | H01L 23/04 | |
| | | | 257/E23.188 | |
| 2005/0087862 A1* | 4/2005 | Shiomi | H01L 23/04 | |
| | | | 257/E23.181 | |
| 2007/0193682 A1* | 8/2007 | Sasaoka | H05K 3/328 | |
| | | | 156/535 | |
| 2008/0258272 A1* | 10/2008 | Lim | H01L 23/49548 | |
| | | | 257/E23.18 | |
| 2008/0271908 A1* | 11/2008 | Yamamoto | H03H 9/1014 | |
| | | | 427/125 | |
| 2011/0037167 A1* | 2/2011 | Iruvanti | H01L 23/367 | |
| | | | 257/E23.101 | |
| 2012/0141818 A1* | 6/2012 | Kajiwara | H01L 23/3735 | |
| | | | 427/299 | |
| 2019/0043775 A1* | 2/2019 | Sanchez | H01L 21/4839 | |
| 2019/0067153 A1* | 2/2019 | Thanu | H01L 23/367 | |
| 2021/0398871 A1* | 12/2021 | Eid | H01L 23/3736 | |

* cited by examiner

201

Receive Heat Spreader
Top Sheet
210

Deposit Interface Material On
Footing of Top Sheet
220

Provide Hybrid Heat
Spreader
230

301

Receive Hybrid Heat
Spreader
310

Receive IC Package
Assembly
315

Dispense High Modulus
Adhesive Upon Interface
Material and/or Package
Substrate Surface
320

Place Hybrid Heat Spreader
Over IC Die & Cure
Adhesive
330

INTEGRATED CIRCUIT HEAT SPREADER INCLUDING SEALANT INTERFACE MATERIAL

BACKGROUND

Integrated circuit (IC) packaging is a stage of microelectronic device manufacture in which an IC that has been fabricated on a die (or chip) comprising a semiconducting material is encapsulated in an "assembly" or "package" that can protect the IC from physical damage and support electrical contacts that connect the IC to a host circuit board or another package. In the IC industry, the process of fabricating a package is often referred to as packaging, or assembly.

A number of IC packaging technologies include a heat spreader to convey heat laterally and vertically away from an IC die to an external component, such as heat sink or heat exchanger (e.g., heat pipe, microfluidic cooler, etc.). FIG. 1A illustrates a partially exploded view of a conventional IC die-integrated heat spreader (IHS) package 101. As shown, a thermal interface material (TIM) 105 is between an IC die 120 and an integrated heat spreader (IHS) 140. TIM 105 has an area (e.g., X-Y plane) that defines a footprint of a dimensionalized preformed "pad" or viscous polymer. The footprint of TIM 105 may be any size suitable for a given IC die 120. One TIM surface is in direct contact with a surface of IC die 120 while a second surface is to be in direct contact with an interior surface 141 of IHS 140.

IHS 140 may be of one or more materials having sufficient thermal conductivity, and may have any thickness suitable to provide rigidity and/or protection to the underlying IC die 120 and TIM 105. IHS 140 has a surface larger than the footprint of TIM 105 allowing for sidewall portions of IHS 140 to enclose IC die 120 and TIM 105. Interior surface 141 is in thermal contact with the TIM 105. Contact surface 142 is affixed to a package substrate 130 with an adhesive sealant 135 surrounding IC die 120.

Package substrate 130 may be any package substrate or a circuit board known and may further include any number of conductive routing layers (not depicted). As further illustrated, IC die 120 is electrically interconnected to substrate 130 by conductive first level interconnects (FLI) 122. FLI 122 may be any type known to be suitable for electrically coupling an IC die, such as, but not limited to, solder features (e.g., solder balls, solder bumps, microbumps, pillars, etc.).

TIM 105 may be in the form of viscous fluid, often referred to as a "thermal grease." A thermal grease can offer good thermal conductivity, but often suffers from instability as thermal cycles are experienced by package 101 during its operation can cause the viscous TIM to flow out or dry out as regions of package 101 strain differently in response to thermal cycles. Even for solid phase thermal interface materials, dynamic die warpage in lidded microelectronic packages can be similarly detrimental to the thermal performance of package 101. As further illustrated in FIG. 1B, with changes in temperature of package 101, a thermal coefficient mismatch between the IC die 120 and substrate 130 can cause them to warp into a non-planar (NP) state while IHS lid 140 remains substantially flat along plane P. Adhesive sealant 135 is conventionally a compliant material (e.g., having a low bulk modulus/hardness) that can undergo a large strain in the z-dimension to accommodate the different strains of package substrate 130 and IHS lid 140 without experiencing very high internal stress. However, as a result of the compliance in adhesive sealant 135, large stress is experienced by TIM 105, which can result in TIM material pump-out, delamination, and/or cracking, particularly near the edges of IC die 120.

Improving the ability of adhesive sealant 135 to sustain greater stress is nontrivial because such stress can cause the IHS lid 140 to delaminate from package substrate 130, causing package 101 to fail.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
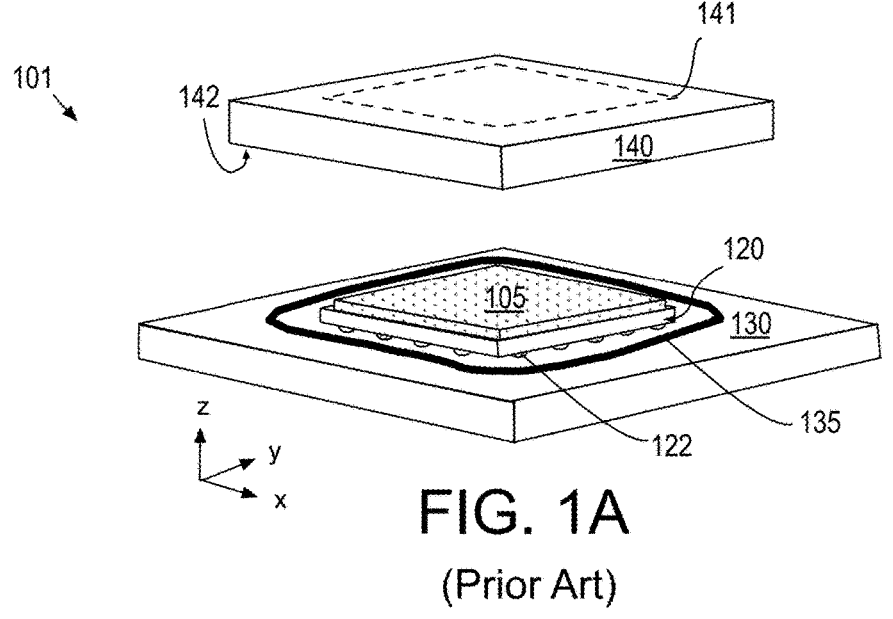
FIG. 1A illustrates an exploded isometric view of an IC die-heat spreader assembly, in accordance with convention.
Figure 1B:
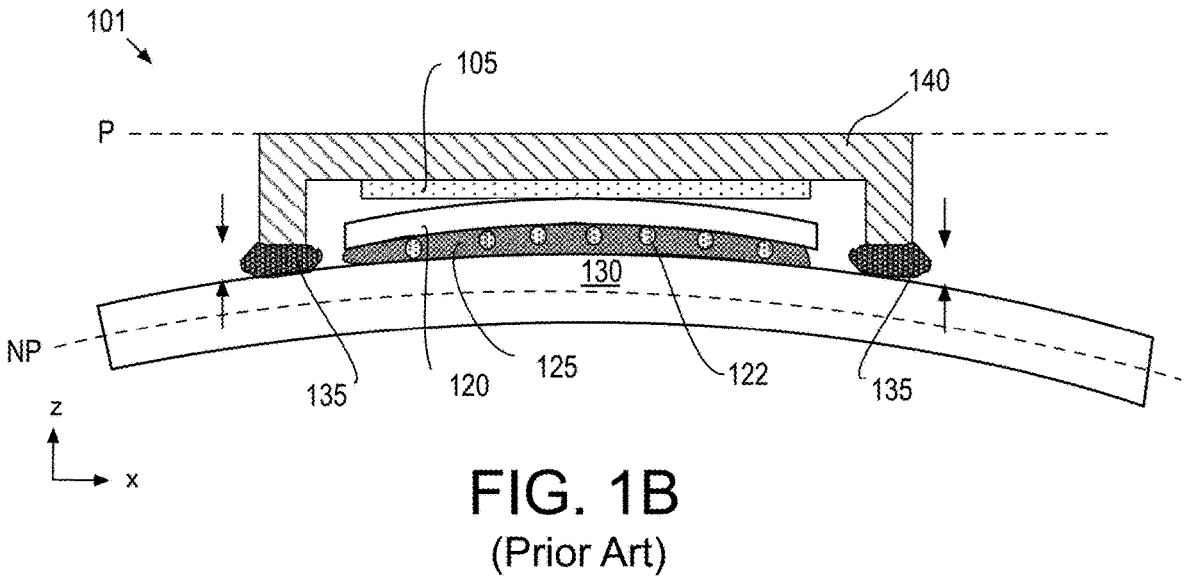
FIG. 1B illustrates a cross-sectional view of the IC die-heat spreader assembly shown in FIG. 1A experiencing warpage at a reference temperature, in accordance with convention.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer disposed over or under another may be directly in contact or may have one or more intervening materials or layers. Moreover, one material or layer disposed between two materials or layers may be directly in contact with the two materials or layers or may have one or more intervening materials or layers. In contrast, a first material or material "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are examples of a hybrid integrated heat spreader (IHS), which may be employed within an IC die package (e.g., single die, multi-die, 3D die stacks, etc.). In the examples below, a sealant interface material is deposited as a footing of a heat spreader to arrive at a hybrid IHS that has both a smooth interior surface finish suitable for high thermal coupling to an IC die, and a sealant interface surface that can be strongly adhered to a package assembly substrate. In some embodiments, a sealant having a high bulk modulus (i.e., high hardness) is applied to the sealant interface material allowing the sealant to sustain higher levels of stress and enabling the hybrid IHS to impart greater mechanical stiffness to the package assembly. Through selection of materials, as well as through the fabrication techniques enlisted to form the hybrid IHS lid, package assemblies including such hybrid IHS lids may have improved TIM performance and a reduced risk of lid/sealant delamination.

Figure 2:
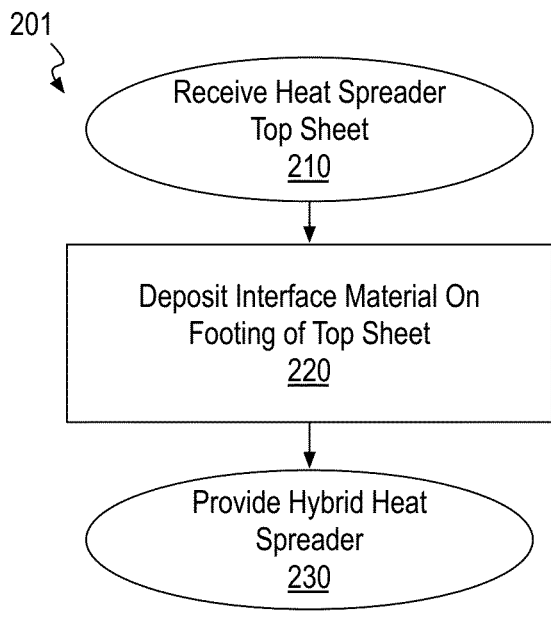
FIG. 2 illustrates a flow diagram of methods forming a hybrid heat spreader suitable for integration into an IC die package assembly, in accordance with some embodiments.

FIG. 2 illustrates a flow diagram of methods 201 for forming a hybrid lid suitable as a heat spreader in an IC die package, in accordance with some embodiments. Methods 201 begin with receiving a heat spreader top sheet at input 210. The heat spreader top sheet may be fabricated upstream of methods 201 to any specifications.

At block 220, a sealant interface material is deposited on the footing of the top sheet to form a hybrid IHS lid. In advantageous embodiments, the sealant interface material is deposited by a high-throughput additive manufacturing (HTAM) process, such as, but not limited to cold spray deposition techniques. As used herein, HTAM processes entail a dispense of one or more source powders upon a workpiece surface where the powder(s) coalesce into the interface material. With such deposition techniques, the interface material may be rapidly formed selectively upon only a portion of a heat spreader lid in an additive manner at high rates (e.g., 50 μm/sec, or more). As described further below, one or more spray nozzles may be scanned over the heat spreader top sheet, for example depositing interface material along a path following an edge and/or sidewall of the top sheet.

The interface material deposited at block 220 may have strong adhesion to the underlying heat spreader top sheet. The interface material may have a composition, and/or microstructure, and/or surface characteristic distinct from that of the top sheet, and to which an adhesive sealant may more strongly adhere. By using HTAM processes to deposit the interface material, the top sheet footing interface can be defined without impacting any of the other surfaces of the heat spreader, thus avoiding further processing of the heat spreader, and avoiding associated costs.

Methods 201 complete at block 230 where the resulting hybrid heat spreader is provided, either as a saleable product (e.g., offered to a component supplier in microelectronics assembly supply chain) or as an internal precursor, for use in the further manufacture of an IC die package assembly.

Figure 3:
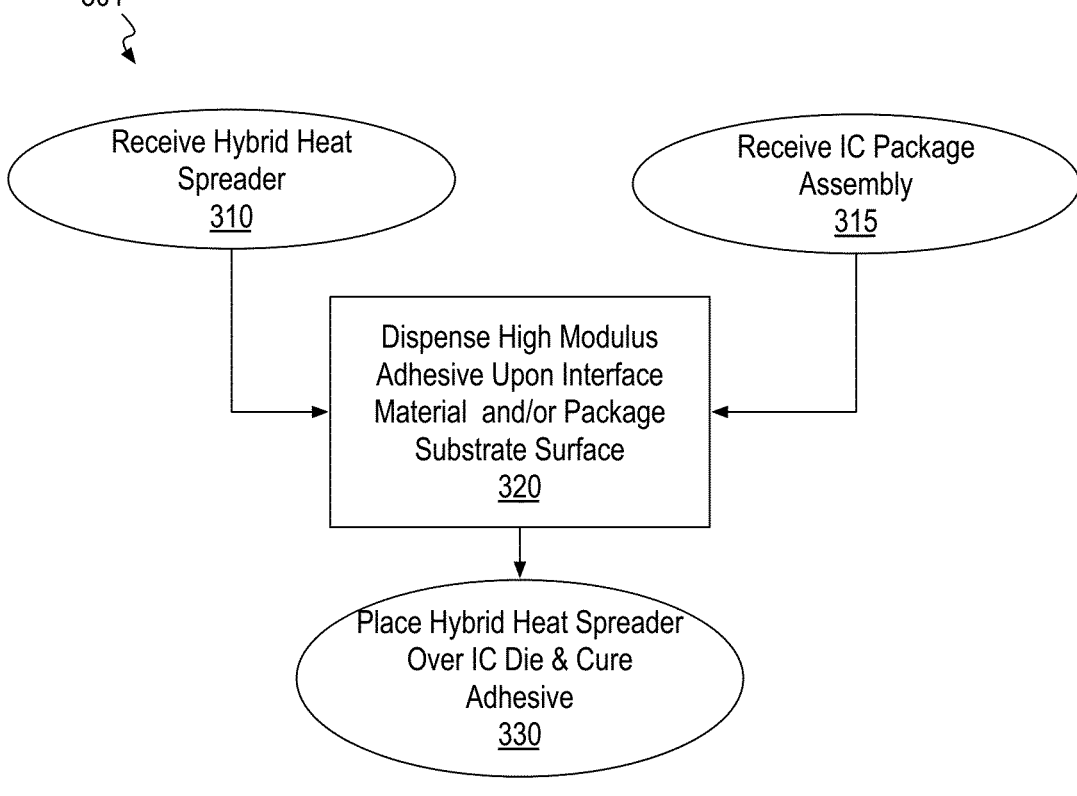
FIG. 3 illustrates a flow diagram of methods of affixing a hybrid heat spreader over an IC die-package substrate assembly, in accordance with some embodiments.

FIG. 3 illustrates a flow diagram of methods 301 for affixing a hybrid lid over an IC die, in accordance with some embodiments. Methods 301 may be performed by a microelectronics assembly house, for example, and begin with receiving a hybrid heat spreader at block 310. The hybrid heat spreader received at block 310 may be any manufactured according to methods 201, for example. In some embodiments, the hybrid heat spreader received at block 310 includes a metallic top sheet with a substantially uniform surface finish over all portions of the top sheet except for a footing which comprises an interface material having a composition, and/or microstructure, and/or surface characteristic distinct from that of a remainder of the heat spreader.

Methods 301 continue at block 320 where an adhesive sealant is dispensed upon at least one of a surface of the interface material and/or upon a package substrate surface of a package assembly received at block 315. The package assembly received at block 315 may include, for example, one or more IC dies electrically interconnected to any known package substrate. In some exemplary embodiments, a TIM is over the one or more IC dies of the package assembly substrate. The adhesive sealant, if applied onto the package assembly substrate, may form a perimeter barrier substantially surrounding the IC die(s).

The sealant interface material in the hybrid IHS lid may enable the use of a high bulk modulus sealant at block 320, which may advantageously sustain a higher stress between the package substrate and the hybrid heat spreader, thereby reducing stress within the TIM relative to a low bulk modulus seal. Although any adhesive sealant may be dispensed at block 320, in some advantageous embodiments the adhesive sealant material is curable to a bulk modulus of at least 100 MPa. The adhesive sealant dispensed at block 320 may also be characterized as curable to a high hardness or low compressibility. In some examples, adhesive sealant deposited at block 320 can be subsequently cured to a hardness of more than 85 on the Shore A (Durometer) scale, and advantageously more than 50 Shore D. In some exemplary embodiments, an organic epoxy resin is deposited at block 320. However, in alternative embodiments where a low bulk modulus sealant (e.g., a silicone derivative) is dispensed at block 320, the sealant interface material may facilitate greater latitude in the choice of sealants and/or reduce the lid delamination rate relative to assemblies including a conventional integrated heat spreader that lacks a sealant interface material in accordance with embodiments herein.

The sealant applied at block 320 may be B-staged until methods 301 are completed at block 330 where the hybrid heat spreader is positioned (e.g., with a pick-and-place machine) over an IC die (e.g., in contact with a TIM) and the adhesive sealant cured, for example by any thermal bake and/or exposure to electromagnetic radiation (e.g., in the UV band) known to be suitable for the particular adhesive sealant. In some examples, the adhesive sealant is cured at block 330 to a hardness of more than 85 Shore A, and advantageously more than 50 Shore D. In some advantageous embodiments the adhesive sealant material is cured to a bulk modulus of at least 100 MPa. The resulting IC die-IHS package may then be provided, either as a saleable product (e.g., offered by a component supplier in microelectronics assembly supply chain) or as an internal precursor, for use in a higher-level (e.g., computer platform/system) integration.

Figure 4A:
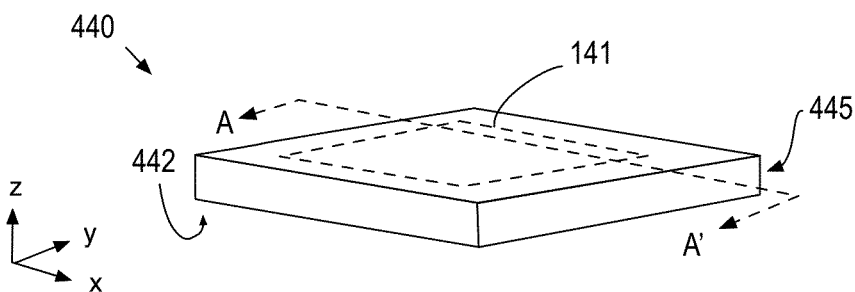
FIG. 4A illustrates an isometric view of a top sheet suitable as an input to the methods illustrated in FIG. 2, in accordance with some embodiments.

FIG. 4A illustrates an isometric view of a top sheet 440, which is suitable as an input to the methods 201. Top sheet 440 has an interior surface area 141 that is to be over one or more IC dies of a package assembly. Top sheet 440 may be a preform with any dimensions so that interior surface area 141 is of a suitable size. For example, top sheet 440 may have a footprint of only 10 mm2 (sufficient for interior surface area 141 to be in thermal contact with a small IC die), up to around 1000 mm2 (sufficient for interior surface area 141 to be in thermal contact with a large IC die, and/or multiple IC dies, etc.). Top sheet 440 may be of one or more materials having sufficient thermal conductivity, and may have any thickness suitable to provide sufficient package rigidity and/or protection to underlying IC die. In exemplary embodiments, top sheet 440 may include a bulk metal, such as copper, stainless steel (alloys of two or more of iron, nickel, manganese, molybdenum, chromium, silicon, or carbon), silver, gold, titanium, aluminum, tungsten, or another sheet good of similarly high thermal conductivity. Top sheet 440 may have a surface finish that offers good corrosion resistance. Such a surface finish is advantageously smooth, having, for example, nearly a mirror finish.

In the illustrated embodiment, a peripheral portion of top sheet 440 includes sidewalls 445. Sidewalls 445 may be provided in the preform as a means of offsetting interior surface area 141 in the vertical direction by an amount sufficient to provide clearance for an IC die and TIM within an interior cavity. In some examples, a peripheral portion of top sheet 440 is stamped, or otherwise deformed or machined into sidewalls 445 at a periphery beyond interior surface area 141. A bottom edge of sidewalls 445 provides a contact surface 442 that is on a plane substantially parallel with interior surface 141. Regardless of whether top sheet 440 includes sidewalls 445, or not, contact surface 442 is at a periphery of top sheet 440 and is to be affixed to a package substrate in some manner that encapsulates an IC die within the heat spreader.

Figure 4B:
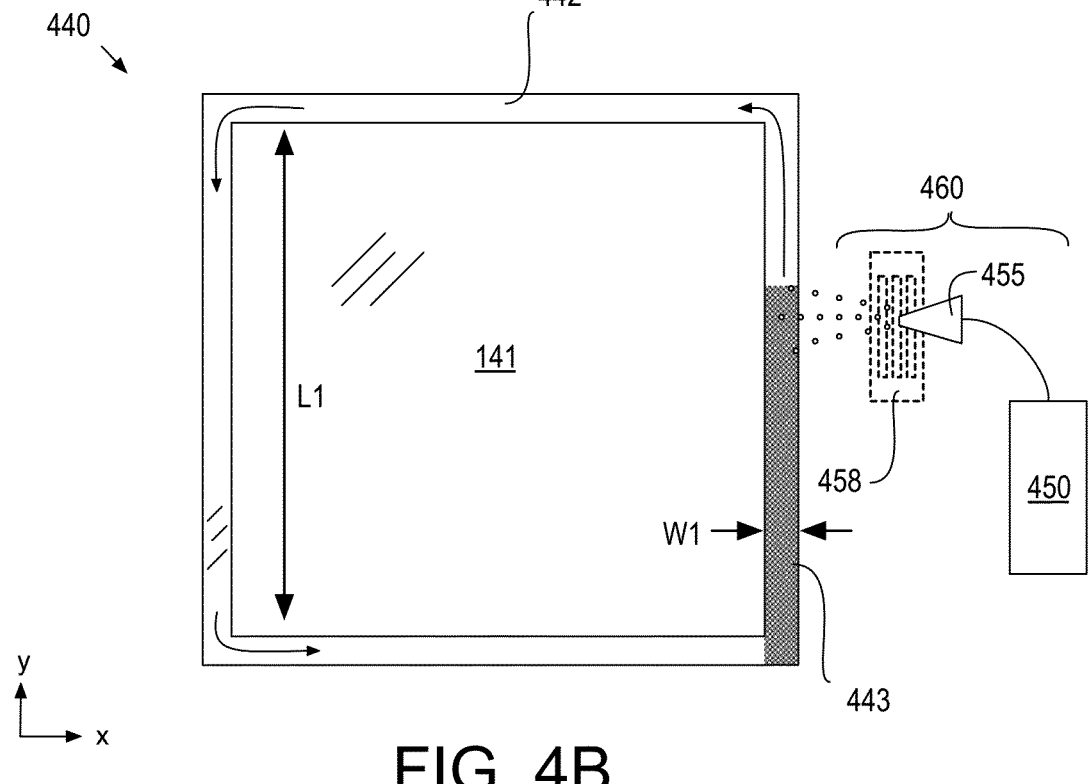
FIG. 4B illustrates a plan view of a bottom side of the top sheet illustrated in FIG. 4A, as a sealant interface material is applied as a footing to the top sheet, in accordance with some embodiments.

FIG. 4B illustrates a plan view of a bottom side of top sheet 440, as a thin film of sealant interface material 443 is deposited upon contact surface 442, in accordance with some HTAM embodiments. As shown, sealant interface material 443 is not deposited on interior surface area 141, and instead the deposition is limited to contact surface 442 at the periphery. Any surface finish of the interior surface area 141 may therefore be retained. Sealant interface material 443 is therefore to, at least in part, provide vertical stand-off for top sheet 440 (augmenting sidewalls 445, if present). Likewise, sealant interface material 443 is also not deposited upon a top surface of top sheet 440 (FIG. 4A), thus allowing any surface finish on the exterior surface of top sheet 440 to be retained in a hybrid IC die package lid.

In the example shown in FIG. 4B, an HTAM process 460 propels one or more source materials 450 in the form of a dry powder through a dispense jet or nozzle 455. During the deposition process, dispense nozzle 455 may be displaced relative to top sheet 440 along a deposition path (e.g., denoted by arrows) to cover the transverse width W1 of contact surface 442 over various longitudinal lengths L1. Although longitudinal length L1 may vary, in some examples it may be tens of millimeters (e.g., 50 mm, or more). Transverse width W1 may also vary, but in some exemplary embodiments may be less than ten millimeters (e.g., 5 mm, or less).

Sealant interface material 443 is formed from jet-borne particles that have impacted together to build up a solid footing upon contact surface 442. While the jet gas may be heated (e.g., to temperatures below the melting temperature of the particles), for cold spray examples there may be no separate external heating of source material 450 and/or top sheet 440. Instead, energy is applied through particle momentum transfer. Source materials 450 may comprise a single material or blends of two or more materials. Malleable and/or ductile particles, such as metallic powders, may be entrained in a high-velocity gas jet and bond to each other and/or the underlying substrate (e.g. contact surface 442) upon impact. As described in greater detail below, malleable particles may also deform upon impact into flattened particles ranging in size from 5 microns to 200 microns that may build upon each other.

As further illustrated in FIG. 4B, the HTAM process 460 may optionally include the use of a deposition stencil 458 to confine the deposition of sealant interface material 443 to feature dimensions smaller than transverse width W1. Deposition stencil 458 is illustrated in dashed line to emphasize its use is optional, for example where sealant interface material 443 is to be deposited with a transverse feature width of 100 μm, or less.

Figure 5:
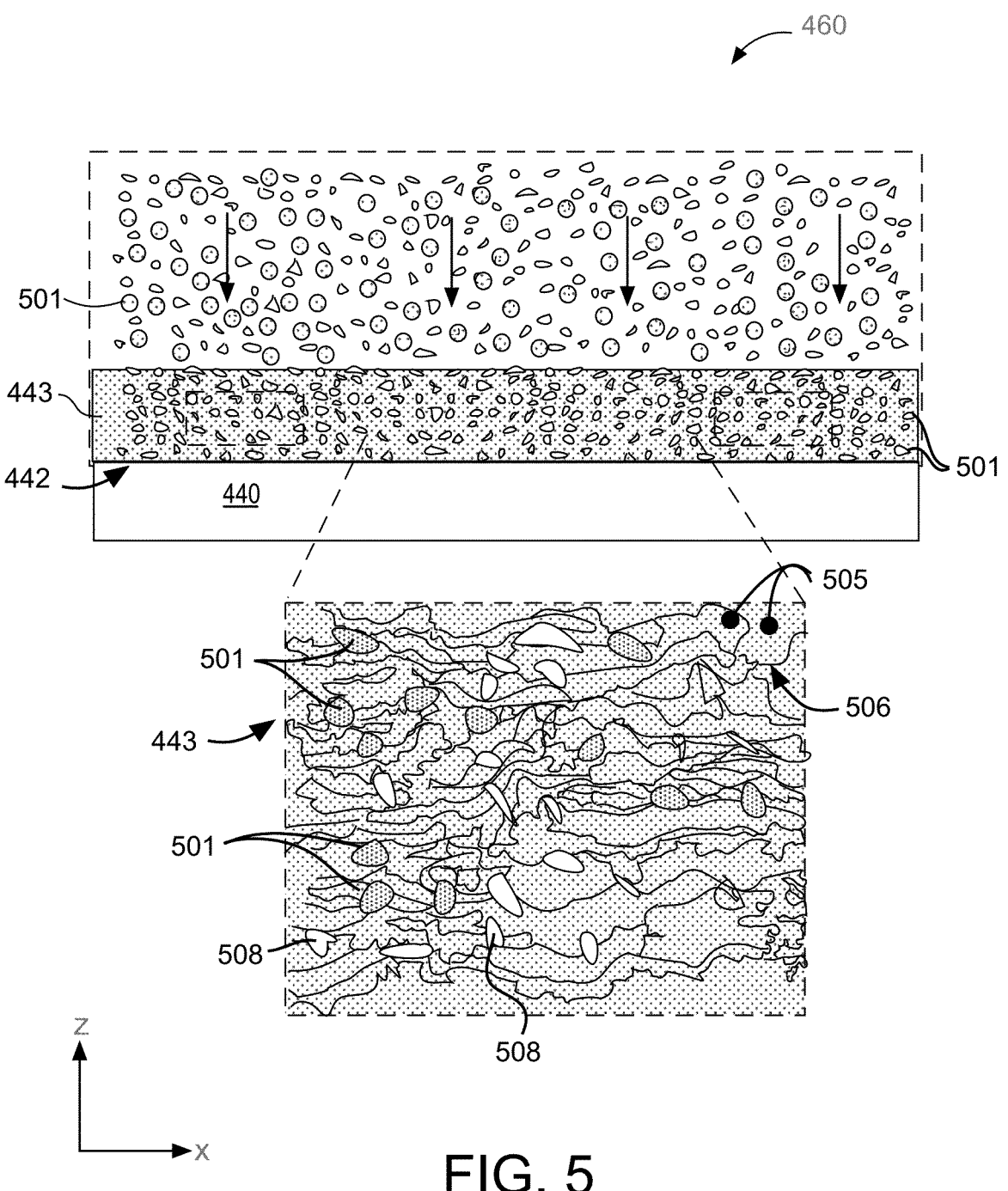
FIG. 5 illustrates the deposition of a sealant interface material with a high throughput additive manufacturing (HTAM) technique, in accordance with some embodiments.

FIG. 5 further illustrates deposition of particles 501 to form sealant interface material 443 upon contact surface 442, in accordance with some HTAM embodiments. As shown, the microstructure of interface material 443 comprises embedded particles 501 and voids 508. At sufficient magnification, boundaries between particles 501 are apparent as distinguished from atomic deposition processes, such as plating. Lamellar structures may be evident within interface material 443, which are indicative of impact between particles and a substrate surface, where most of the particles plastically deform and flatten or otherwise splat. Particles may impact each other in succession, forming stacks of contiguous irregular or regular-shaped lamellae 505. In some embodiments, individual lamellae 505 are delineated by discernable boundaries 506, which may be observed at magnifications below 500×. In other embodiments, lamellae 505 may not be apparent at even higher magnifications.

Because particles 501 may have irregular shapes, voids 508 can appear at boundaries 506 between embedded particles 501. As such, the porosity of interface material 443 may be higher than that of the underlying top sheet 440. Porosity may be expressed as % voiding area (as measured from a cross sectional micrograph). The microstructure of materials formed by cold spray or thermal spray processes may therefore have larger void areas than materials having substantially the same composition formed by other techniques. Voiding area is generally a well-characterized quality control parameter that can be monitored in spray deposition processes. While bulk material, and thin film materials deposited by other means (e.g., atomic techniques), typically have void areas of zero, materials deposited by HTAM processes may have void areas ranging from 0.1% to 0.5%, or more. Hence, the existence of voids 508, is indicative of interface material 443 having been formed by an HTAM process, such as spray deposition (e.g., a cold spray process).

Figure 6A:
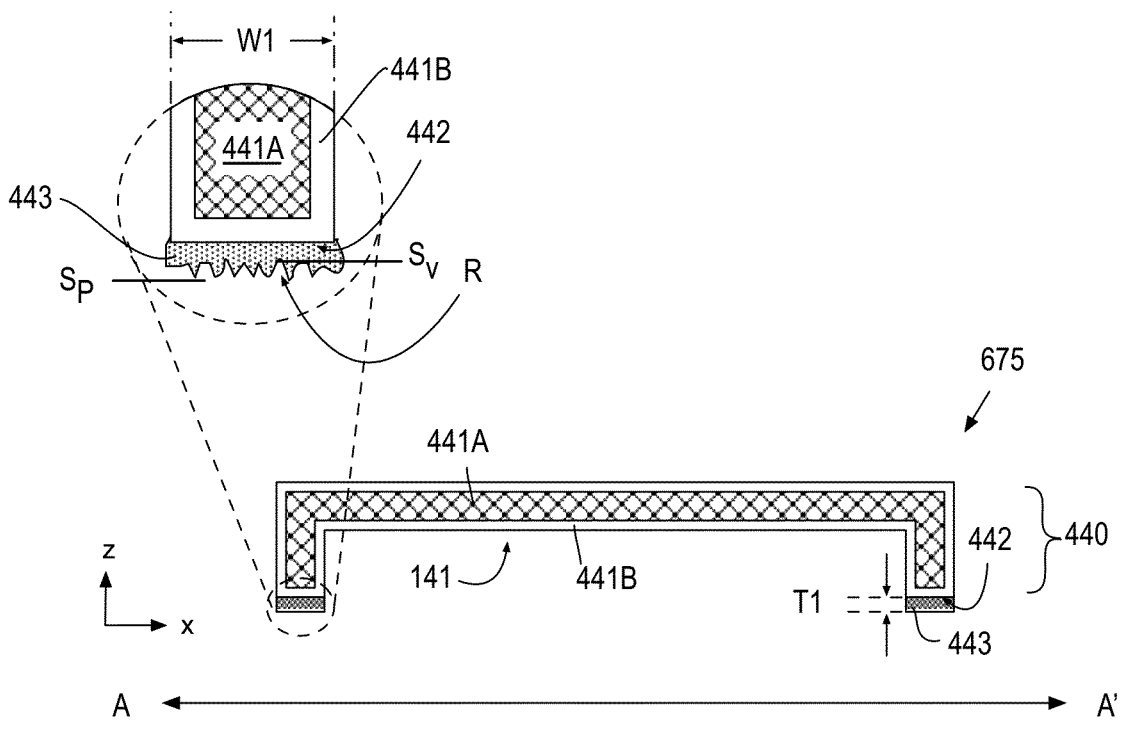
FIG. 6A is an isometric view of a hybrid heat spreader including a sealant interface material, in accordance with some embodiments.

FIG. 6A illustrates a cross-sectional view of a hybrid heat spreader lid 675 including sealant interface material 443 that has been deposited over substantially all of contact surface 442, in accordance with some embodiments. In this example, top sheet 440 has been deformed at the periphery to vertically offset interior surface area 141 by some height (z-dimension). The cross-sectional view illustrated in FIG. 6A is along the dashed A-A' line denoted in FIG. 4A that passes through a thickness of top sheet 440 and following deposition of sealant interface material 443. In the example illustrated in FIG. 6A, top sheet 440 includes a bulk metal 441A covered with a surface finish 441B. In exemplary embodiments, bulk metal 441A is a first metal (alloy) while surface finish 441B is a second metal (alloy). Either or both of bulk metal 441A and surface finish 441B may comprise one or more of Cu, Fe, Ni, Mn, Mo, Cr, Ag, Au, Ti, Al, W, Si, C, for example. In some exemplary embodiments, bulk metal 441A comprises predominantly Cu while surface finish 441B comprises predominantly Ni.

Sealant interface material 443 has a thickness T1, as measured in a direction substantially orthogonal from a plane of contact surface 442. Thickness T1 may vary and interface material 443 may, in some instances, be exclusively relied upon to vertically offset a substantially 2D top sheet 440. However, in the example illustrated where top sheet 440 has an interior cavity, sealant interface material 443 is a thin film with a thickness T1 being less than 500 μm, and advantageously no greater than 250 μm. As shown, sealant interface material 443 is in direct contact with surface finish 441B (i.e., surface finish 441B is between sealant interface material 443 and bulk metal 441A).

Sealant interface material 443 may have a different composition than top sheet 440 and/or have a greater surface roughness than top sheet 440. The composition and/or microstructure and/or surface morphology of sealant interface material 443 may be selected so that a sealant material is able to achieve a stronger bond than it would directly to contact surface 442 (in the absence of sealant interface material 443). Sealant interface material 443 may have a substantially homogenous composition, for example where an HTAM deposition employs only one source material. Alternatively, sealant interface material 443 may be a composite of a plurality of material particles having different compositions, for example where an HTAM deposition employs multiple source materials. Sealant interface material 443 may also have a layered structure, for example where source materials are switched during a sequential HTAM deposition process.

In some examples, sealant interface material 443 comprises particles of one or more metal, such as indium, bismuth, tin, gallium, copper, iron, nickel, manganese, molybdenum, chromium, silver, gold, titanium, aluminum, tungsten, or platinum. In some embodiments, sealant interface material 443 has a composition distinct from that of top sheet 440. For example, where top sheet 440 is a first metal alloy or metallic compound (e.g., comprising one or more of Cu, Fe, Ni, Mn, Mo, Cr, Ag, Au, Ti, Al, W), sealant interface material 443 is another metal alloy or metallic compound (e.g., comprising one or more of Cu, Fe, Ni, Mn, Mo, Cr, Ag, Au, Ti, Al, W). In sealant interface material 443, particles of metal may be crystalline, with crystal orientations of particles being random so that heat spreader material lacks significant crystal texture.

In some other exemplary embodiments, sealant interface material comprises particles of a non-metal, such as one or more of, silicon, carbon, nitrogen or oxygen. Such non-metal particles may also be crystalline, for example with crystalline carbon present as diamond particles, or graphite particles. In some embodiments, particles 501 are compounds, such as AlN particles, BN particles, SiC particles, $Al_2O_3$ particles, etc.

Sealant interface material 443 may therefore comprise a blend of metal and non-metal materials. Particles of the non-metal, (e.g., diamond or graphite, metal nitrides, metal oxides etc.) may be embedded in a matrix of the malleable and/or ductile metal particles. Sealant interface material 443 may therefore be similar to a ceramic, comprising both metal particles and non-metal (dielectric) particles. For some such embodiments, sealant interface material 443 has a lower atomic % of metal (or a greater atomic % of non-metals) than top sheet 440. Particles may also have a composition that varies as a function of thickness, for example, in either layered to gradient structures.

In examples where top sheet 440 includes surface finish 441B, sealant interface material 443 has a different composition and/or greater surface roughness than at least surface finish 441B. Sealant interface material 443 may also have a different composition than bulk metal 441A, although the two materials may also have substantially the same composition. In some examples where surface finish 441B comprises Ni, which generally does not have good surface chemical bonding properties to some sealants, sealant interface material 443 is substantially free of Ni. Sealant interface material 443 may instead comprise predominantly a metal that is capable of forming strong surface chemical bonds, such as, Cu or Al.

As further illustrated in the expanded view of FIG. 6A, sealant interface material 443 has a greater surface roughness R than the underlying contact surface 442. In some embodiments interface material 443 has an RMS roughness of at least 10 μm. Contact surface 442 may have a much lower RMS surface roughness, for example less than 1 μm, which is typical for a specular surface finish. For the cross-section illustrated in FIG. 6A, surface roughness R may also be characterized as a roughness profile with peaks and valleys varying between a minimum surface profile valley Sv and a maximum surface profile peak Sp that differ by at least 10 μm in the vertical direction.

Figure 6B:
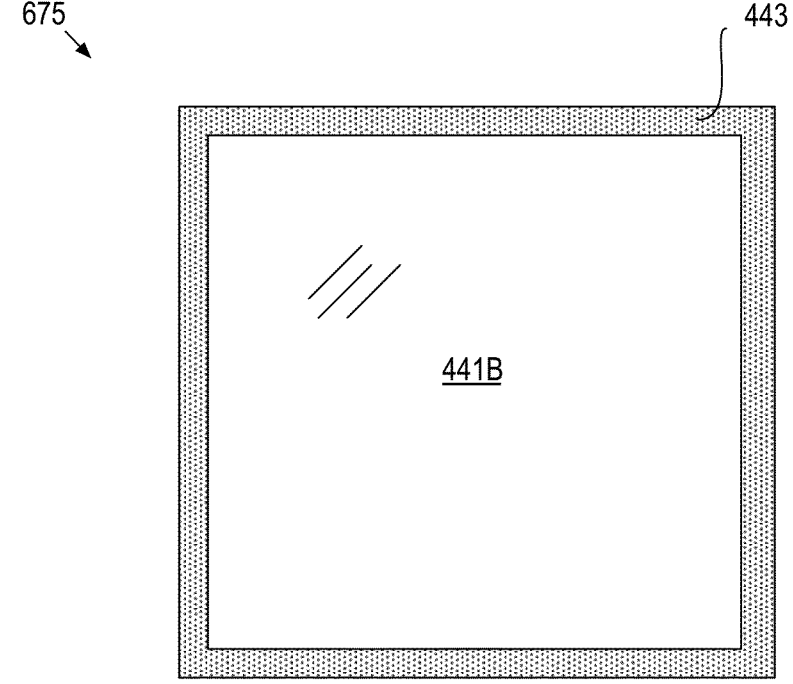
FIG. 6B illustrates a plan view of a bottom side of the hybrid heat spreader lid illustrated in FIG. 6A, in accordance with some embodiments.

FIG. 6B illustrates a plan view of a bottom side of hybrid heat spreader 675, in accordance with some embodiments. As shown, sealant interface material 443 is located only within a periphery of hybrid heat spreader lid 675, and surface finish 441B remains exposed within the interior surface area 141.

Figure 6C:
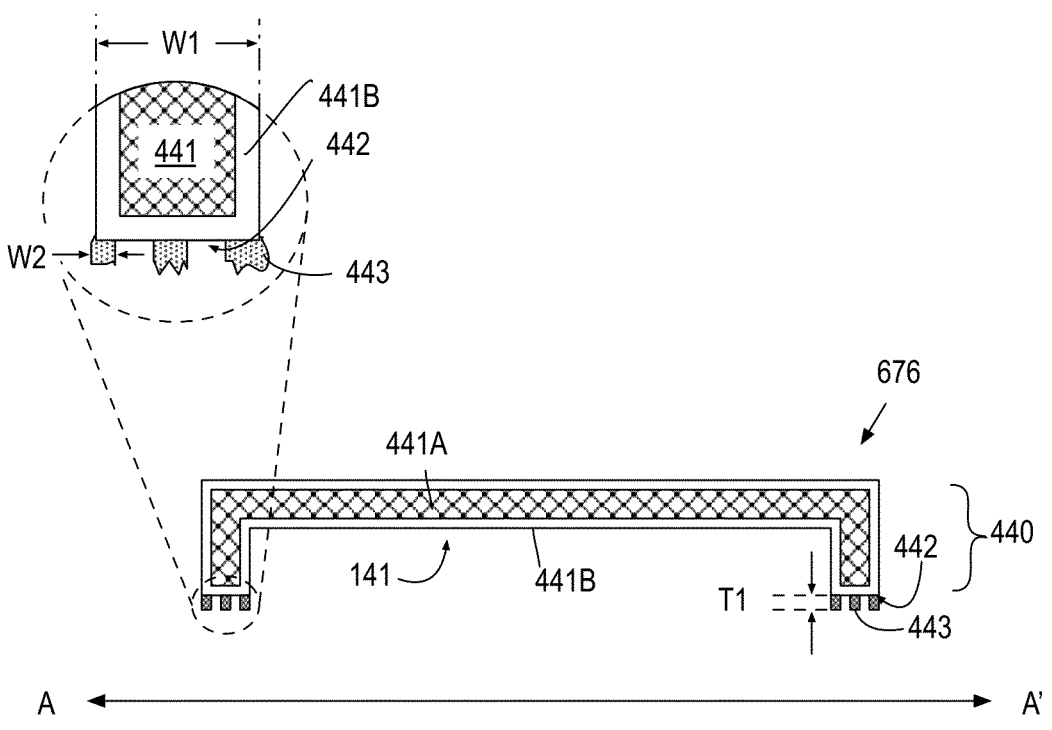
FIG. 6C illustrates a cross-sectional view of a hybrid heat spreader including a sealant interface material, in accordance with some alternative embodiments.

FIG. 6C illustrates a cross-sectional view of a hybrid heat spreader 676 that includes a plurality of concentric parallel ridges of sealant interface material 443, in accordance with some alternative embodiments. Hybrid heat spreader 676 may have any of the attributes described above in the context of hybrid heat spreader 675, however hybrid heat spreader 676 has multiple ridges of sealant interface material 443 within the transverse width W1 of contact surface 442. As further illustrated in the expanded view of FIG. 6C, each ridge of interface material 443 has a transverse width W2 that is significantly smaller than transverse width W1. In some examples where transverse width W1 is less than 5 mm (e.g., 4 mm), transverse width W2 is less than 1 mm (e.g., a few hundred μm). Between each ridge is a space, which may be 1 mm, or less, for example, where contact surface 442 is exposed. Such ridges of sealant interface material may be deposited with an HTAM process that employs a stencil, for example. While each ridge of sealant interface material 443 may have the same range of surface roughness described above, the creation of those ridges of heights T1 may increase the total surface area of interface material 443 that comes into contact with a sealant, thus further promoting a strong adhesive bond to hybrid heat spreader 676.

Figure 6D:
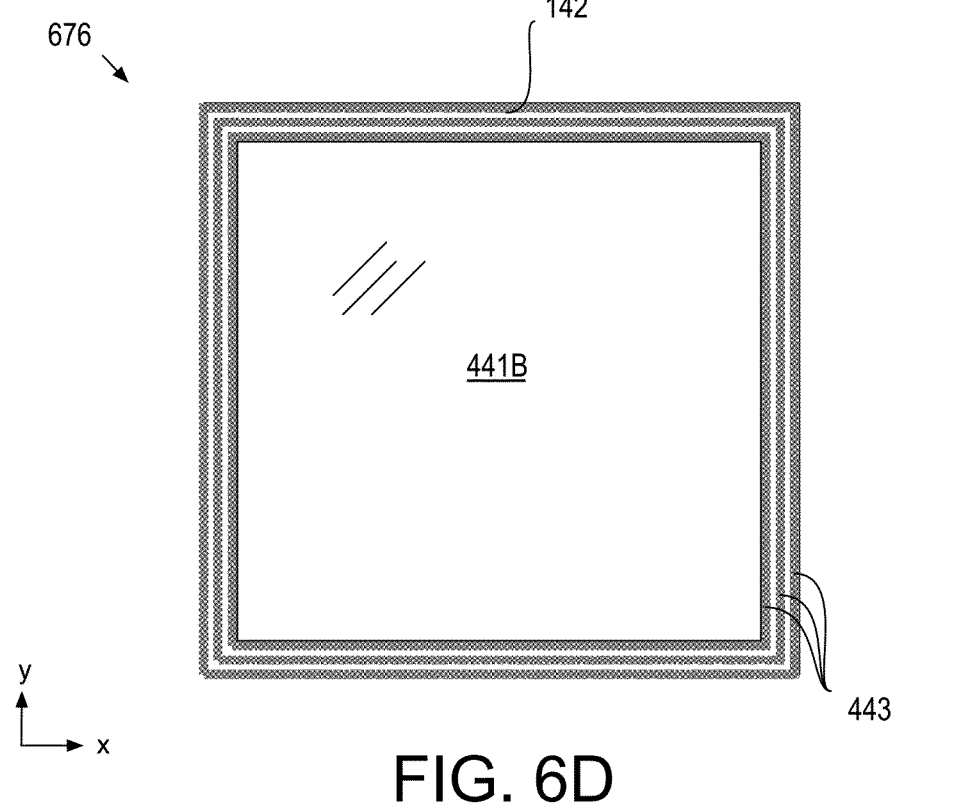
FIG. 6D illustrates a plan view of a bottom side of the hybrid heat spreader lid illustrated in FIG. 6C, in accordance with some embodiments.

FIG. 6D illustrates a plan view of a bottom side of hybrid heat spreader 676, in accordance with some embodiments. As shown, the three concentric ridges of sealant interface material 443 are within a periphery of hybrid heat spreader 676. Sealant interface material 443 is not deposited on interior surface area 141 so that surface finish 441B remains exposed within the interior surface area.

Figure 7A:
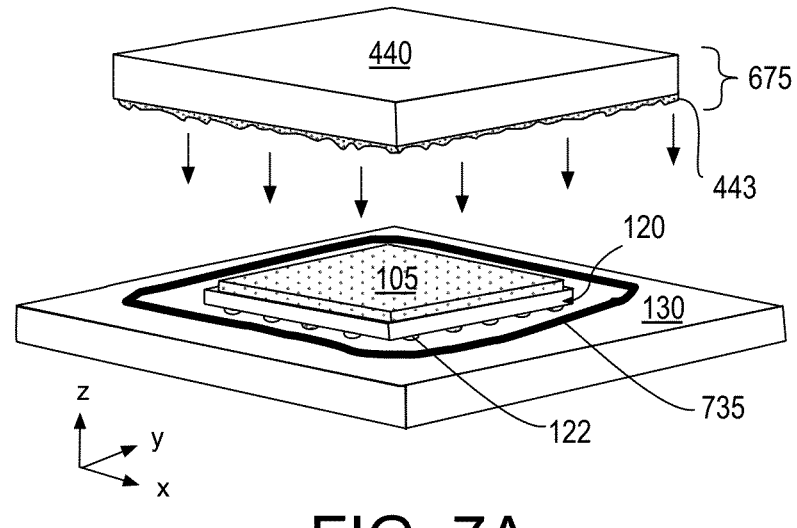
FIG. 7A is an isometric view illustrating a hybrid integrated heat spreader being assembled upon a package substrate, in accordance with some embodiments of the methods illustrated in FIG. 3.

In some embodiments, an IC device further includes a hybrid IHS, for example having one or more of the attributes described above. FIG. 7A illustrates an exploded isometric view of a hybrid integrated heat spreader being assembled upon a package substrate, in accordance with some embodiments of methods 301 (FIG. 3), for example. The exploded view illustrates hybrid IHS 675 being applied to contact an exposed surface of an IC die-package substrate assembly 701 to integrate hybrid IHS lid 675 into the package assembly.

As shown, an adhesive sealant 735 has been dispensed upon a package substrate 130 to surround IC die 120. Adhesive sealant 735 may have any composition, but in some exemplary embodiments adhesive sealant 735 comprises a curable organic epoxy resin. Package substrate 130 may be any package substrate or a circuit board that may further include any number of conductive routing layers (not depicted). In some exemplary embodiments, package substrate 130 comprises one or more layers of organic epoxy resin. In other embodiments, package substrate 130 comprises a crystalline material (e.g., silicon interposer). IC die 120 may include one or more ICs, such as, but not limited to, power management ICs (PMICs), radio frequency communication ICs (RFICs), microprocessors (e.g., application processors, central processors, graphics processors), memory ICs (e.g., DRAM), or System on a Chip (SoC) ICs that may include two or more of these types of ICs, etc. In the illustrated example, only one IC die 120 is illustrated, however more than one IC die may be similarly interconnected to substrate 130 by FLI 122.

As further illustrated in FIG. 7A, hybrid heat spreader 675 is aligned with the bead of adhesive sealant 735, lowered into place over IC die 120 and brought into contact with TIM 105, for example with a pick-and-place machine. Hybrid heat spreader 675 is pressed against TIM 105 until sealant interface material 443 makes contact with adhesive sealant 735. Adhesive sealant 735 is then cured (e.g., by UV and/or thermal bake) while a compressive force is maintained on TIM 105.

Figure 7B:
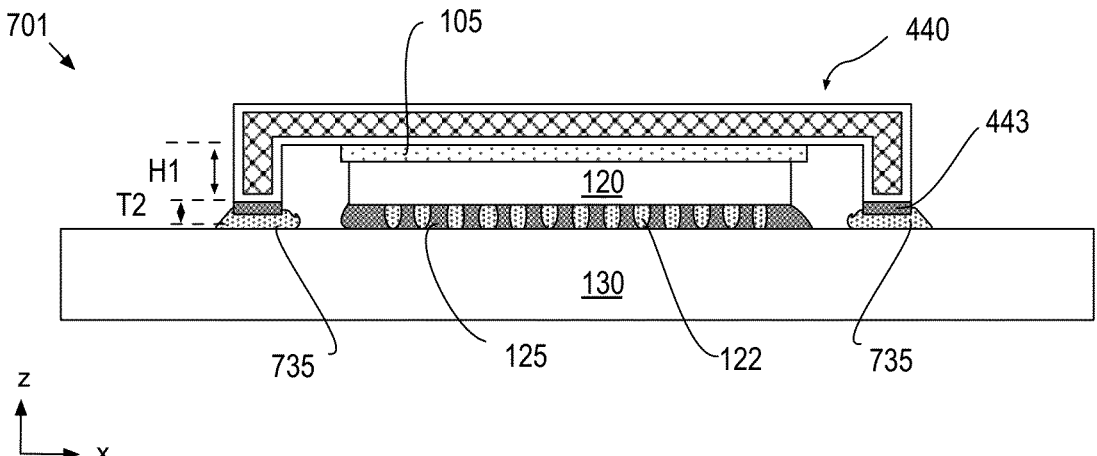
FIG. 7B illustrates a cross-sectional view of an IC die-hybrid integrated heat spreader package, in accordance with some embodiments.

FIG. 7B illustrates a cross-sectional view of an IC die-hybrid IHS package 701, in accordance with some embodiments. Package 701 may be the product of assembling a hybrid integrated heat spreader onto a package substrate, for example. Within package 701, interior surface of top sheet 440 is in direct contact with TIM 105 while sealant interface material 443 is in direct contact with adhesive sealant 735. TIM 105 advantageously has a relatively low bulk modulus and sufficient material thickness to accommodate irregularities between opposing package components by compressing significantly (e.g., 30-70%) under load. In some examples, TIM 105 has a bulk modulus below 100 MPa, and advantageously 85 MPa, or less. In some carbon-based embodiments, TIM 105 comprises a graphitic material (e.g., crystalline graphite, pyrolytic graphite). TIM 105 may further comprise a polymer having high temperature stability, such as, but not limited to, silicone-based polymers (i.e., polysiloxanes comprising silicon, oxygen, carbon), or synthetic rubbers. In other embodiments, TIM 105 is a low melting point metal (e.g., solder TIM, etc.) or liquid metal, comprising one or more of In, Au, Sn, Ag, Bi, Ga, or Cu.

In the example illustrated in FIG. 7B, top sheet 440 has a sidewall stand-off height H1. Adhesive sealant 735 and sealant interface material 443 sum to a thickness T2 that is less than sidewall stand-off height H1. The sum of H1 and T2 is approximately equal to the sum of a thickness of IC die 120, a thickness of TIM 105, and a thickness of FLI 122 and/or surrounding IC die underfill 125. In exemplary embodiments, adhesive sealant 735 has a bulk modulus of more than 85 Shore A, and advantageously of at least 50 Shore D.

Figure 8:
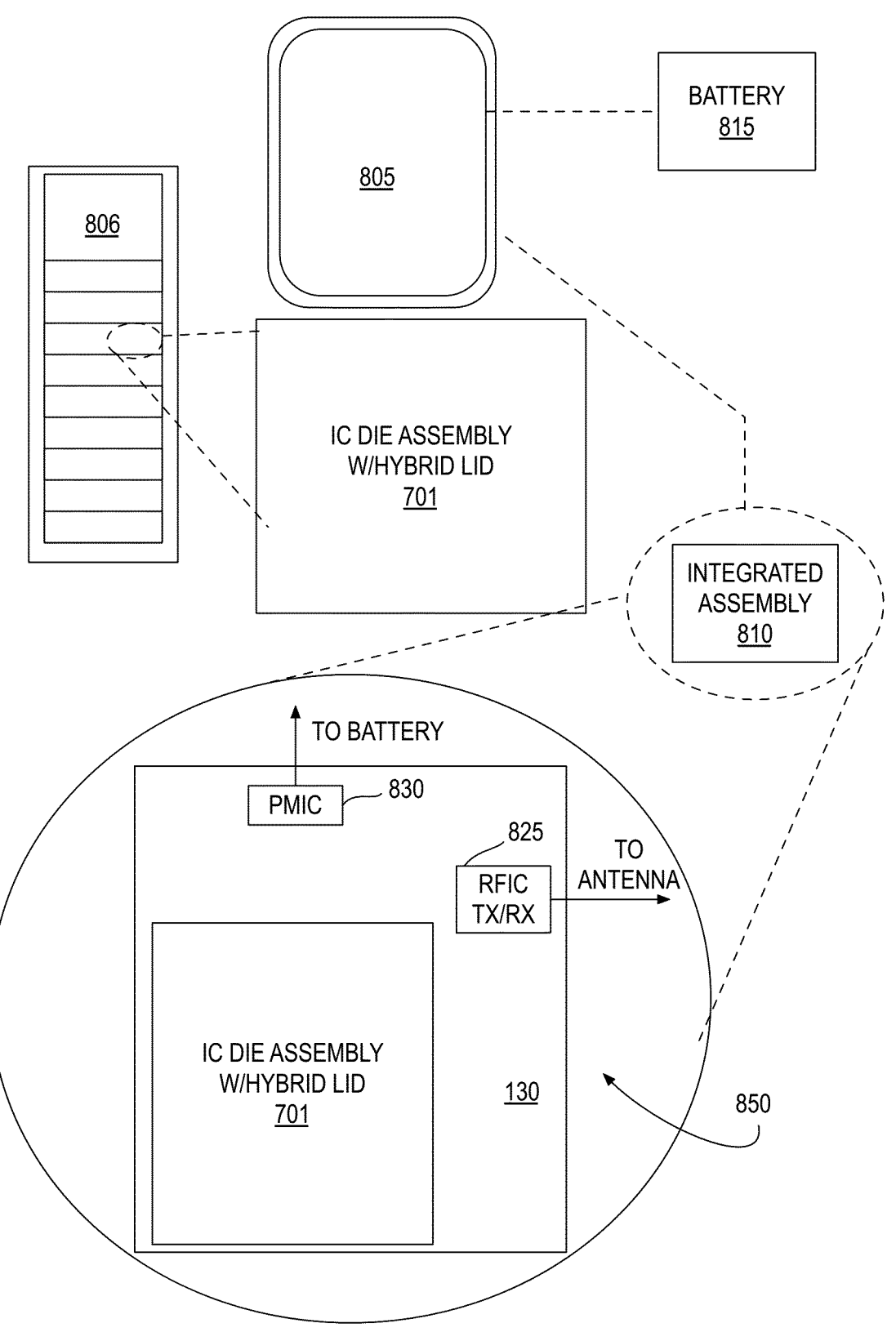
FIG. 8 illustrates a mobile computing platform and a data server machine employing an IC die-hybrid integrated heat spreader package, in accordance with some embodiments.

In some embodiments, a computer platform includes an IC die-hybrid IHS package, for example having one or more of the attributes described above. FIG. 8 illustrates a mobile computing platform and a data server computing platform, each employing an IC die-hybrid IHS package. The server machine 806 may be any commercial server, for example including any number of high-performance computing platforms disposed within a rack and networked together for electronic data processing, which in the exemplary embodiment includes IC die-hybrid IHS package 701, for example as described above. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated assembly 810, and a battery 815.

IC die-hybrid IHS package 701 includes a memory IC and processor IC, and further includes a hybrid IHS, for example as described elsewhere herein. The hybrid IHS may be further attached by a high modulus adhesive to a package substrate that is interconnected to a PCB. For example, as shown in the expanded view 850, package 701 is coupled to package substrate 130. Package substrate 130 may further host one or more additional IC die packages, such as a power management integrated circuit (PMIC) package 830, or RF (wireless) integrated circuit (RFIC) package 825, for example.

PMIC 830 may perform battery power regulation, DC-to-DC conversion, etc., and so has an input coupled to battery 815 and with an output providing a current supply to other functional modules. As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 9:
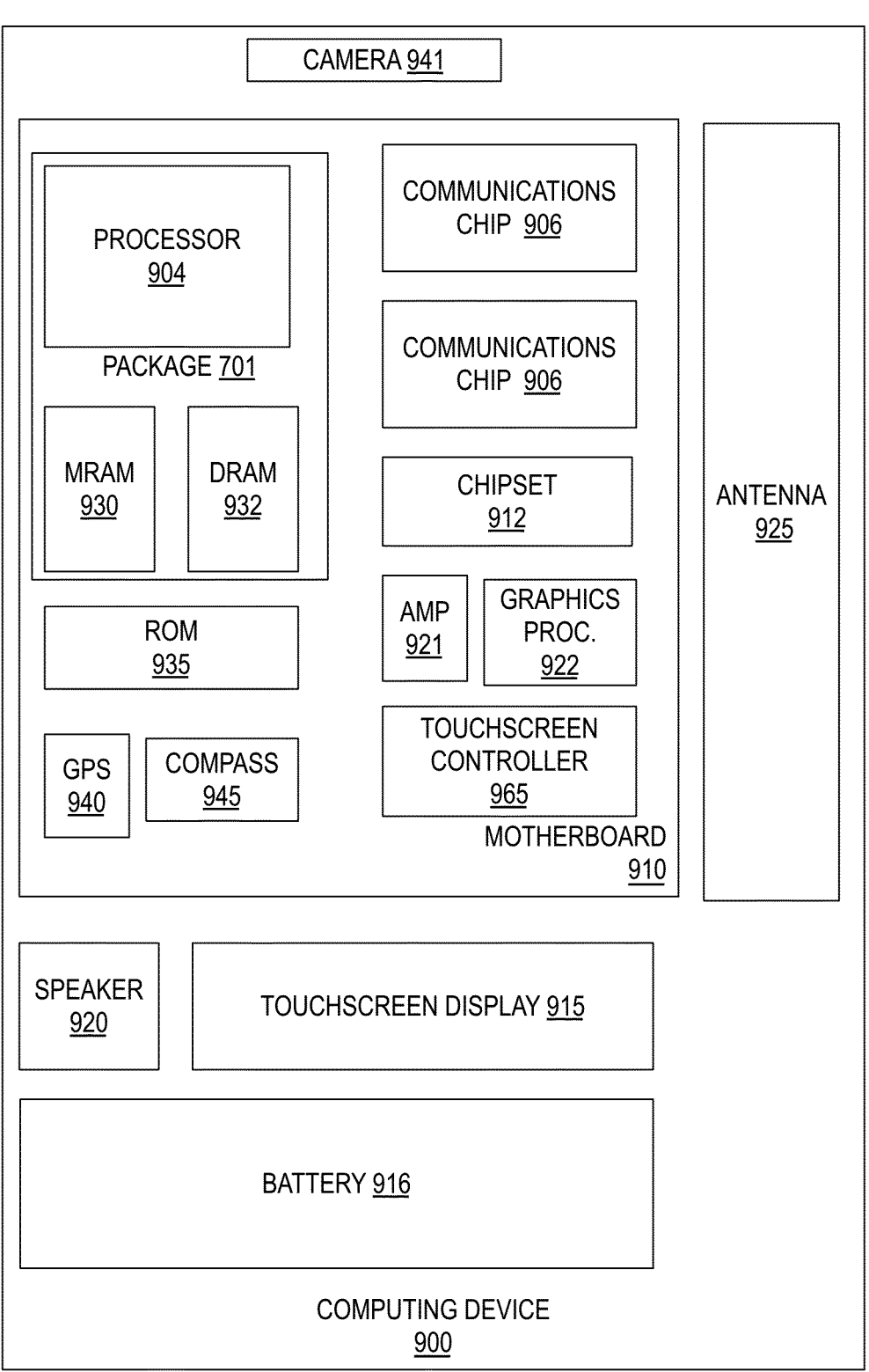
FIG. 9 is a functional block diagram of an electronic computing device, in accordance with some embodiments.

FIG. 9 is a functional block diagram of an electronic computing device 900, in accordance with an embodiment of the present invention. Computing device 900 may be found inside mobile platform 805 or server platform 806, for example. Device 900 further includes a motherboard 910 hosting a number of components, such as, but not limited to, a processor 904 (e.g., an applications processor). Processor 904 may be physically and/or electrically coupled to motherboard 910. In some examples, processor 904 includes an IC die integrated with a hybrid IHS in package 701. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 910. In further implementations, communication chips 906 may be part of processor 904. Depending on its applications, computing device 900 may include other components that may or may not be physically and electrically coupled to motherboard 910. These other components include, but are not limited to, volatile memory (e.g., DRAM 932), non-volatile memory (e.g., ROM 935), flash memory (e.g., NAND or NOR), magnetic memory (MRAM 930), a graphics processor 922, a digital signal processor, a crypto processor, a chipset 912, an antenna 925, touchscreen display 915, touchscreen controller 965, battery 916, audio codec, video codec, power amplifier 921, global positioning system (GPS) device 940, compass 945, accelerometer, gyroscope, speaker 920, camera 941, and mass storage device (such as hard disk drive, solid-state drive (SSD), compact disk (CD), digital versatile disk (DVD), and so forth), or the like. In some exemplary embodiments, at least one of the functional blocks noted above comprise an IC package assembly including a hybrid IHS, for example as described elsewhere herein.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) die package heat spreader comprises a top sheet having an interior surface area that is to be over an IC die, the top sheet comprising a first material, and a thin film of interface material on a periphery of the top sheet, wherein the interface material substantially encloses the interior area, and has at least one of a different composition or greater surface roughness than the first material.

In second examples, for any of the first examples the thin film of interface material has a thickness of no more than 250 µm, and a transverse width of no more than 5 mm, and the interior surface area exceeds 10 mm2.

In third examples, for any of the first through second examples the thin film of interface material comprises two or more ridges of the interface material, and wherein the first material is within a space between the parallel ridges of the interface material.

In fourth examples, for any of the first through third examples a surface of the interface material has an RMS roughness of at least 10 µm.

In fifth examples, for any of the first through fourth examples the first material is a first metal, and the interface material is a second metal.

In sixth examples, for any of the first through fifth examples the first material comprises at least one of Au, Ag, Cu, Ti, W, Al, Fe, Cr, Mo, Si, or C, and the second material comprises at least one of Au, Ag, Cu, Ti, W, Al, Fe, Cr, Mo, Si, or C.

In seventh examples, for any of the first through sixth examples the top sheet further comprises a bulk metal underlying the first material, and the first material is between the bulk metal and the interface material.

In eighth examples, for any of the seventh examples the bulk metal comprises Cu.

In ninth examples, for any of the seventh through eighth examples the interface material comprises at least one of Cu or Al and the surface of the interface material has an RMS roughness of at least 10 µm.

In tenth examples, for any of the first through ninth examples the interior surface area is within an interior cavity of the top sheet surrounded by a sidewall comprising the first material, and wherein the thin film of interface material is on the bottom surface of the sidewall in a plane substantially parallel to a plane of the interior surface area.

In eleventh examples, for any of the tenth examples the first material is a surface finish upon an underlying bulk material, the surface finish on an exterior surface of the top sheet, opposite the interior surface, and wherein the interface material is in contact with the first material.

In twelfth examples, an integrated circuit (IC) die package comprises a package substrate, an IC die coupled to a first region of the package substrate; a heat spreader comprising a top sheet comprising a first material and having an interior surface area over the IC die. The IC die package comprises an interface material on a periphery of the top sheet, wherein the interface material substantially surrounds the interior area, and has at least one of a different composition or greater surface roughness than the first material; and an adhesive sealant is in contact with the interface material and with a second region of the package substrate that substantially surrounds the first region.

In thirteenth examples, for any of the twelfth examples the adhesive sealant has a bulk modulus of more than 85 Shore A.

In fourteenth examples, for any of the twelfth through thirteenth examples the adhesive sealant comprises an epoxy resin, the first material has an RMS surface roughness less than 10 µm, and a surface of the interface material in contact with the adhesive sealant has a profile roughness of at least 10 µm between a maximum peak and a minimum valley.

In fifteenth examples, for any of the twelfth through fourteenth examples the thin film of interface material has a thickness of no more than 250 µm, the top sheet further comprises a bulk metal underlying the first material, and the first material is between the bulk metal and the interface material.

In sixteenth examples, for any of the twelfth through fifteenth examples the IC die package further comprises a thermal interface material (TIM) between the IC die and the interior surface, wherein the TIM is in contact with the first material.

In seventeenth examples, a computer platform comprises a power supply, and the IC die package of any of the twelfth through sixteenth examples coupled to the power supply.

In eighteenth examples, a method of fabricating an IC die heat spreader lid, the method comprises receiving a heat spreader lid including an interior surface area that is to be over an IC die, and cold spraying a thin film of interface material onto a region of the heat spreader lid that substantially surrounds the interior surface area.

In nineteenth examples, for any of the eighteenth examples the heat spreader lid comprises a first material and where the interface material has at least one of a different composition or greater surface roughness than the first material.

In twentieth examples, for any of the nineteenth examples the cold spraying further comprises propelling one or more powders through a stencil.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) die package heat spreader, comprising:

a top sheet having an interior surface area that is to be over an IC die, the top sheet comprising a metal surface finish covering an underlying material, wherein the metal surface finish has an RMS surface roughness of less than 1 µm; and an interface material on a periphery of the top sheet, wherein the interface material substantially encloses the interior surface area and is absent from the interior surface area, and wherein the interface material has a different composition than the metal surface finish, and wherein the interface material has an RMS surface roughness of at least 10 µm.

2. The IC die package heat spreader of claim 1, wherein:

the interface material has a thickness of no more than 250 µm, and a transverse width of no more than 5 mm; and the interior surface area exceeds 10 mm².

3. The IC die package heat spreader of claim 1, wherein the interface material comprises two or more ridges of the interface material, and wherein the metal surface finish is exposed within a space between the ridges of the interface material.

4. The IC die package heat spreader of claim 1, wherein:

the metal surface finish is a first metal or metal alloy; and the interface material is a second metal or metal alloy.

5. The IC die package heat spreader of claim 1, wherein the metal surface finish comprises Ni and the interface material comprises at least one of Au, Ag, Cu, Ti, W, Al, Fe, Cr, Mo, Si, or C.

6. The IC die package heat spreader of claim 1, wherein the top sheet further comprises a bulk metal underlying the metal surface finish, and wherein the metal surface finish is between the bulk metal and the interface material.

7. The IC die package heat spreader of claim 6, wherein the bulk metal comprises Cu.

8. The IC die package heat spreader of claim 6, wherein the interface material comprises at least one of Cu or Al.

9. The IC die package heat spreader of claim 1, wherein the interior surface area is within an interior cavity of the top sheet surrounded by a sidewall comprising the metal surface finish, and wherein the interface material is on bottom surface of the sidewall in a plane substantially parallel to a plane of the interior surface area.

10. The IC die package heat spreader of claim 9, wherein the metal surface finish is on an exterior surface of the top sheet, opposite the interior surface area, and wherein the interface material is in contact with the the metal surface finish.

11. An integrated circuit (IC) die package, comprising:
a package substrate;
an IC die coupled to a first region of the package substrate; and
the IC die package heat spreader of claim 1, wherein the interior surface area is over the IC die coupled to the first region of the package substrate.

12. The IC die package heat spreader of claim 1, wherein the interface material has a void area ranging from 0.1% to 0.5%.

13. The IC die package of claim 11, further comprising an adhesive sealant in contact with the interface material and with a second region of the package substrate that substantially surrounds the first region.

14. The IC die package of claim 13, wherein the adhesive sealant has a bulk modulus of more than 85 Shore A.

15. The IC die package of claim 14, wherein:
the adhesive sealant comprises an epoxy resin;
the surface finish has an RMS surface roughness less than 10 µm; and a surface of the interface material in contact with the adhesive sealant has a profile roughness of at least 10 µm between a maximum peak and a minimum valley.

16. The IC die package of claim 11, further comprising a thermal interface material (TIM) between the IC die and the interior surface.

17. A computer platform comprising:
a power supply; and
the IC die package of claim 11 coupled to the power supply.

18. An integrated circuit (IC) die package, comprising:
a package substrate;
an IC die coupled to a first region of the package substrate;
a heat spreader over the IC die, wherein the heat spreader comprises:
a top sheet having an interior surface area that is over the IC die, the top sheet comprising a metal surface finish covering an underlying material; and
an interface material on a periphery of the top sheet, wherein the interface material substantially encloses the interior surface area and is absent from the interior surface area, wherein the interface material has a different composition than the surface finish, wherein a surface roughness is greater for the interface material than the for surface finish, and wherein the interface material has a surface roughness profile with peaks and valleys varying between a minimum surface profile valley and a maximum surface profile peak that differ by at least 10 µm in a direction normal to a plane of the top sheet; and
an adhesive sealant in contact with the interface material and in contact with a second region of the package substrate that substantially surrounds the first region.

19. The IC die package of claim 18, wherein the adhesive sealant has a bulk modulus of more than 85 Shore A.

* * * * *